United States Patent [19]

Endoh et al.

[11] Patent Number: 4,845,313

[45] Date of Patent: Jul. 4, 1989

[54] METALLIC CORE WIRING SUBSTRATE

[75] Inventors: Satoru Endoh; Ohnishi Katsuga, both of Kanagawa, Japan

[73] Assignee: Tokyo Communication Equipment Co., Ltd., Kanagawa, Japan

[21] Appl. No.: 43,287

[22] PCT Filed: Jul. 22, 1986

[86] PCT No.: PCT/JP86/00386

§ 371 Date: Mar. 19, 1987

§ 102(e) Date: Mar. 19, 1987

[30] Foreign Application Priority Data

Jul. 22, 1985 [JP] Japan ................... 60-161711

[51] Int. Cl.4 ............................................. H05K 3/44
[52] U.S. Cl. .................... 174/68.5; 174/52.4; 361/414
[58] Field of Search ........... 361/414; 174/68.5, 52 FP

[56] References Cited

U.S. PATENT DOCUMENTS

| 3,383,564 | 5/1968 | Lalmond | 174/68.5 |
| 3,440,722 | 4/1969 | Paulson | 361/414 X |
| 3,459,880 | 8/1969 | Erdle | 174/117 FF |
| 3,628,105 | 3/1969 | Sakai et al. | 174/52 FP |
| 3,903,594 | 9/1975 | Koneval | 174/68.5 X |
| 4,164,071 | 8/1979 | Kruzich | 174/68.5 X |
| 4,659,931 | 4/1987 | Schmitz et al. | 174/68.5 X |
| 4,687,695 | 8/1987 | Hamby | 174/68.5 X |
| 4,694,123 | 9/1987 | Massey | 361/414 X |

FOREIGN PATENT DOCUMENTS

| 242157 | 5/1960 | Australia | 361/414 |
| 56-78197 | 6/1981 | Japan . | |
| 58-9399 | 1/1983 | Japan . | |
| 61-27665 | 2/1986 | Japan . | |
| 1157432 | 7/1969 | United Kingdom | 361/414 |
| 1190128 | 4/1970 | United Kingdom | 361/414 |

Primary Examiner—R. R. Kucia
Attorney, Agent, or Firm—Wenderoth, Lind & Ponack

[57] ABSTRACT

A metallic core printed circuit board having a number of lead terminals such as IC or LSI lead terminals provided on at least one edge of an electrically conductive substrate which forms a core by etching or other process. The respective terminals are electrically insulated from and secured to the core by an insulating binder, and then either conductor circuit patterns are directly formed on or a printed board wherein a printed circuit has been completed is bonded to the layer of the insulating binder. The metallic core printed circuit board makes it possible to increase a packaging density of required components, to allow easy connection to other circuit boards such as a mother board and the like, and to reduce a volume of the circuit.

20 Claims, 5 Drawing Sheets

METALLIC CORE WIRING SUBSTRATE

BACKGROUND OF THE INVENTION

1. Field of the Invention

The present invention relates to a metallic core wiring substrate, and particularly to a metallic core wiring substrate which is suitable for manufacturing printed wiring used for packaging required components at a high density or for a hybrid integrated circuit (HIC).

2. Description of the Prior Art

A conventional metallic core wiring substrate which has been widely sued heretofore is manufactured by applying an insulating layer to the surface of a metallic plate to form a core, and additional steps are performed to define the required electrically conductive patterns, through holes or the like on the insulating layer. Accordingly, there is a disadvantage in that the manufacturing process is complicated with the result that the products become expensive. In order to eliminate the above described disadvantage, there has been proposed a method wherein a printed board is directly bonded to the surface of a core metal and components are then packaged on the printed board. However, with a construction according to the above method wherein circuit patterns are formed on the back of the surface of the printed board joined with the core metal) of the printed board, and the circuit patterns are connected with components to be packaged on the surface of the printed board via through holes in order to increase the density of the components it is difficult to maintain the insulation between the components and the circuit patterns on the back of the printed board. Hence, the above described construction is hardly accepted, and furthermore, it involves a disadvantage in that separate lead terminals must be further attached to the printed boards if the provision of the lead terminals is required. Furthermore, since a pad is used at the connection between the lead terminals and the wiring patterns, the space for packaging the components is narrowed by a width of the pad in the above described construction, so that it cannot satisfy the requirement for miniaturization of the electronic circuit.

It has been heretofore common to employ a ceramic sheet or a plastic laminate as the substrate for manufacturing a hybrid IC. However, such a ceramic sheet itself is expensive, and in addition, a silver-palladium paste is required for forming electrically conductive patterns on the sheet, so that the resulting product becomes more expensive. In addition, when it is intended to utilize both surfaces of the ceramic substrate in order to elevate a wiring density, through holes are necessary and the processing therefor is considerably troublesome.

On the other hand, the latter substrate, i.e. a plastic laminate, does not involve the problems as mentioned above, but a step for connecting lead terminals with the laminate is required in order to secure them in this case also so that considerable time is necessary therefor. Furthermore, in the case where a metallic core printed circuit is vertically connected to a mother board through these lead terminals, the printed circuit provided upright becomes higher by a height corresponding to a stationary part of lead terminals. Thus, there is a particularly disadvantageous drawback for the case where there is a severe requirement for the miniaturization of electronic circuit.

It is an object of the present invention to eliminate the disadvantages involved in the conventional metallic core wiring substrates as mentioned above, particularly the disadvantages of a decrease in a packaging density for the components and an increase in a height of the lamination. Another object of the present invention is to provide a metallic core wiring substrate which makes a connection between an electronic circuit provided on the substrate and lead terminals easy and solves a problem in a case involving further connection thereof with another printed circuit.

SUMMARY OF THE INVENTION

In order to attain the above-mentioned objects, the metallic core wiring substrate according to the present invention has a construction as described hereinbelow. A flat electrically conductive sheet is formed by a method such as etching or the like, into a required shape incorporating lead terminals and a metallic core such that they are coplanar, the surface of the electrically conductive substrate is covered with an insulating material, and thereafter either electrically conductive patterns are formed on the covering or a printed board having a completed printed circuit is provided on either or both sides of the metallic core by bonding to the entire surface of the covering by means of an adhesive, and the wiring patterns are connected with lead terminal base portions formed on the periphery of the core by the use of, for example, solder via through holes or the like on the printed board.

BRIEF DESCRIPTION OF THE DRAWINGS

FIGS. 1(a) and (b) are, respectively, a perspective view and a sectional view taken along the line A—A of FIG. 1(a), showing an example of the metallic core wiring substrate according to the present invention.

FIGS. 5(a1)–(a9) are sectional views taken along the line Y—Y of FIG. 4(a) illustrating a manufacturing process of the example in FIGS. 4(a) and (b);

DESCRIPTION OF THE PREFERRED EMBODIMENTS

The present invention will be described in detail hereinbelow by referring to the accompanying drawings.

Figures 1A, 1B:
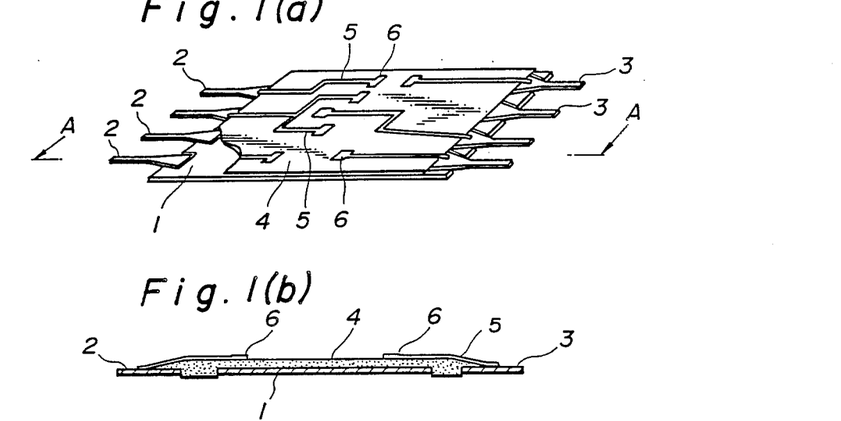

FIGS. 1(a) and (b) are a perspective view and a sectional view taken along the line A—A of FIG. 1(a) showing an example of the metallic core wiring substrate according to the present invention wherein base portions of lead terminals 2 and 3 are provided in the same plane and extend from the side edges of an electrically conductive sheet 1 which together form a core of the substrate wherein the base portions of the lead terminals 2, 3 are in an electrically insulated condition with respect to the conductive sheet 1 in a manner discussed hereafter, and these base portions are integrally secured by means of an insulating covering 4. Thereafter, electrically conductive patterns 5 are formed on the surface of said covering 4 by printing or like manner, such required patterns are connected with the surfaces of the lead terminals 2 and 3 and further, soldering paste 6 for binding electronic parts is disposed on required positions of the patterns 5.

Figure 2:
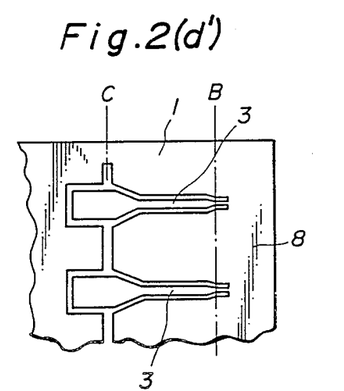
FIGS. 2(a)–(f) including FIG. 2(d') are view illustrating a manufacturing process of the example in FIGS. 1(a) and (b)
Figure 2A:
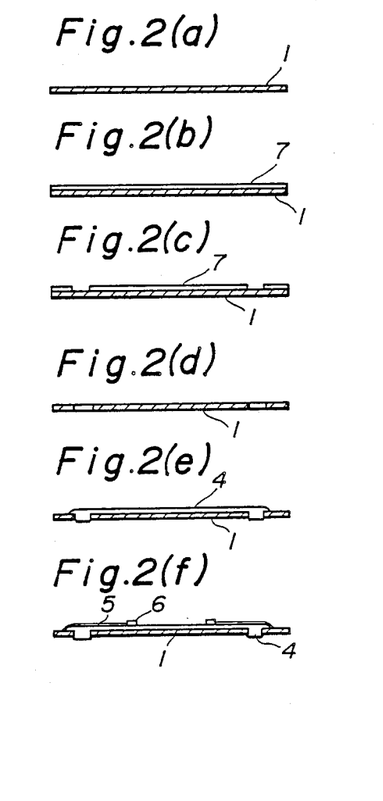

The metallic core wiring substrate as mentioned above can be easily manufactured in accordance with the process, for example, as shown in FIGS. 2(a)–(f). More specifically, the conductive sheet 1 having a required thickness and made of iron, copper, phosphor bronze or the like is prepared as shown in FIG. 2(a), either a photo resist 7 is applied to or a dry film is bonded to the surface of the conductive sheet 1 (FIG. 2(b)), the resulting conductive sheet surface is exposed by the use of a required mask, the sensitized portions of the photo resist 7 are then removed (FIG. 2(c)), and thereafter the sheet 1 thus obtained is etched to form the base portions of the lead terminal (FIG. 2(d)). In this case, the lead terminals 2 (The base portions of the lead terminals 2 are preferably formed by cut-outs in the edge portions of the metallic core which together are arranged in a zigzag manner the cut-outs having a shape which is more narrow in a direction toward the outer periphery the substrate and the base portions are wider in a direction extending inwardly from the outer periphery of the substrate.) have been held with a suitable lead frame 8 which is an extended portion of the substrate 1 in such a manner that the lead terminals 2 are not separated from the substrate 1 (FIG. 2(d')), and after completing the following covering process with the insulating material 4 (FIG. 2(e)), the lead frame 8 may be cut off at the positions B and C indicated by each dot-and-dash line.

The insulating material 4 may be provided in such a manner that an adherent high-molecular dielectric material or porcelain enamel is suitably selected, and either the so selected material is applied or printed by means as a screen printing process.

Then, the required pattern 5 may be printed on the surface of the insulating covering 4 by using an electrically conductive printing ink, and further, the soldering paste 6 may be printed at the required position on each pattern 5 (FIG. 2(f)).

While the essential construction of the present invention has been described above, electronic parts may also be packaged on the opposite surfaces of the metallic core wiring substrate according to the present invention in order to increase an area for packaging such electronic parts in accordance with the following manner.

FIGS. 3(a)–(i) are diagrams illustrating a manufacturing process for an example of the substrate wherein through holes are generally required in the case of packaging electronic parts on the opposite surfaces of a substrate. In this respect, a photo resist 7 is applied to the opposite surfaces of an electrically conductive core 1 (FIGS. 3(a) and (b)), each photo resist is sensitized through a mask having required patterns (FIG. 3(c)), and the so sensitized substrate is then etched to define through holes 11 (FIG. 3(d)). Furthermore, the wiring substrate of the present example may be constructed in such a manner that the opposite surfaces of the resulting substrate 1 with through holes are covered with an insulating material 4 (FIG. 3(e)), thereafter required electrically conductive patterns are formed on the opposite surfaces of the insulating covering 4 by printing with an electrically conductive paste 5, and at the same time the paste to maintain a conductive state of the opposite surfaces of the substrate (FIG. 3(f)).

Figure 3A:
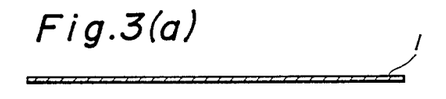
FIGS. 3(a)–(i) are view illustrating a process for manufacturing a hybrid IC by utilizing the metallic core wiring substrate according to the present invention.
Figures 3B, 3C:
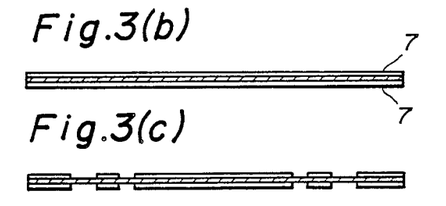
Figure 3D:
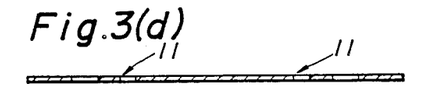
Figure 3E:
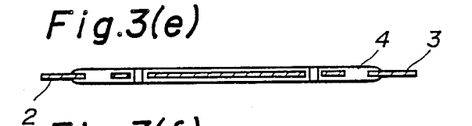
Figure 3F:
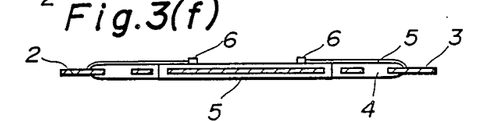
Figure 3G:
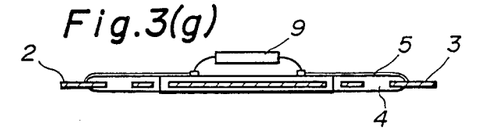
Figure 3H:
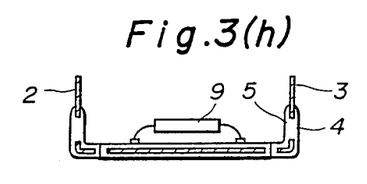
Figure 3I:
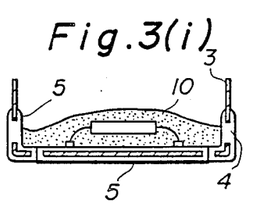

A required electronic part 9, IC or the like is connected with the conductive pattern 5 on the metallic core wiring substrate manufactured as described above at the required positions (FIG. 3(g)), both the side edges of the substrate 1 are bent into a dual in-line package (DIP) configuration (FIG. 3(h)), and the electronic part 9 or the like is molded together with the conductive pattern 5 by utilizing a molding material 10 such as a plastic material or the like (FIG. 3(i)) to obtain a DIP type hybrid IC.

As a matter of course, the order of the manufacturing process may be changed, and more specifically, the bending process shown in FIG. 3(h) may be replaced by the molding process in FIG. 3(i), and the bending process in FIG. 3(h) may also be exchanged for the packaging process for the electronic part 9 or the like in FIG. 3(g).

Moreover, when the lead terminals are provided on either edge of the metallic core wiring substrate, it will be self-evident that a single in-line package (SIP) type hybrid IC is obtained, although the illustration of the manufacturing processes has been omitted.

In the meantime, a manner for directly applying electrically conductive patterns to a metallic core wiring substrate is required for such a process wherein both the conductive patterns on the opposite surfaces of the substrate are connected by means of through holes, or wherein both the conductive patterns are connected by means of a connecting material which extends a long way around an edge of the substrate in the case where packaging for electronic parts is intended to be at a high density. In either case, however, its process becomes complicated so that the above manner is disadvantageous from the point of view of cost.

In order to solve the above problem, a flexible printed circuit in which wiring has been previously completed may be bonded to the surface of a metallic core wiring substrate wherein lead terminals are provided on at least one edge of a metallic sheet to be the core by the use of an adhesive.

Figure 4A:
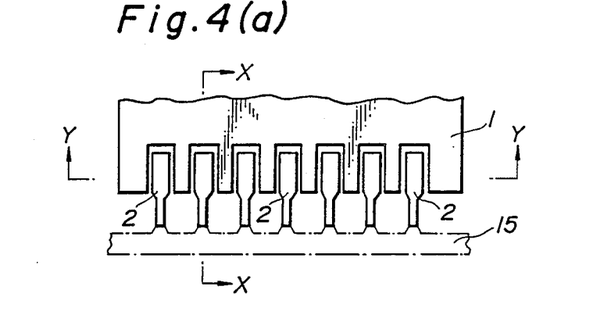
FIGS. 4(a) and (b) are, respectively, a partial planar view and a sectional view taken along the line X—X of FIG. 4(a) illustrating another example of the present invention.
Figure 4B:
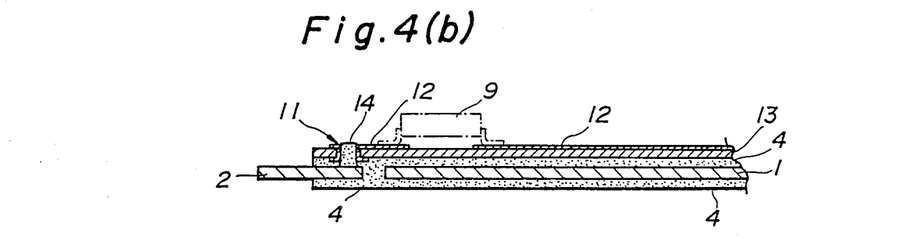

FIG. 4(b) is a sectional view taken along the line A—A of FIG. 4(a), which is a planar view showing the metallic core according to the present invention, illustrating an example for realizing the idea as mentioned above. Lead terminal 2 are provided on the outer periphery of a metallic sheet 1 to be the core of a substrate at suitable positions in accordance with the previously mentioned manner such as by etching or the like and spacings defined between base portions of the lead terminals and the metallic sheet 1 to be the core are insulated and fixed by means of an adhesive. A flexible substrate 13 on which wiring of a printed pattern 12 has previously been completed is bonded to the whole surface of the core 1 by using the above-mentioned adhesive 4. In this case, a through hole 11 is optionally defined on the flexible printed substrate 12, 13 at the position corresponding to the base portion of a lead terminal 2, the adhesive 4 is arranged so as to not be deposited at this position and the base portion of the lead terminal 2 is connected with the wiring pattern 12 by means of solder 14 extending through the hole 11.

In these circumstances, a part 9 to be packaged may be connected and secured to the printed pattern 12 in accordance with a manner such as reflow or the like.

The metallic core wiring substrate having the construction as described above can be easily manufactured in accordance with, for example, such a technique as described hereinbelow.

Figure 5:
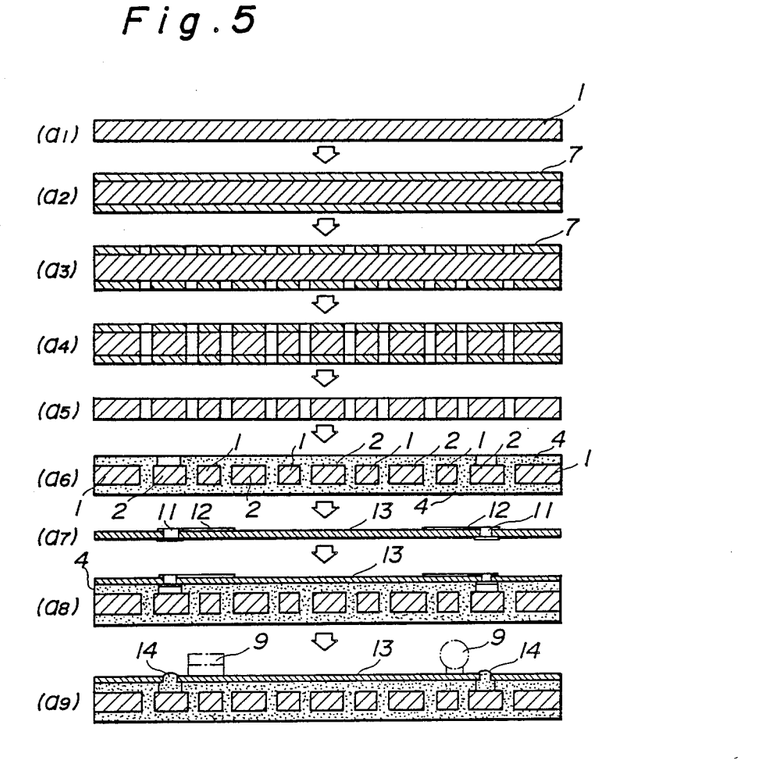

FIGS. 5(a1)-(a9) are explanatory sectional views each taken along the line Y—Y of FIG. 4(a) wherein first, a sheet to be core having a thickness of 0.1 to 1.0 mm and made of iron, silicon steel, copper, phosphor bronze or the like is prepared, either a photosensitive resin 7 is applied to the surface of the sheet or a photosensitive film 7 is bonded to the sheet's surface, after which the sheet is exposed to ultraviolet light by the sue of a mask having the required patterns which are developed to expose only desired portions on the surface of the metallic sheet, thereafter the so developed sheet is etched by a normal method. Thus, lead terminals 2 having a desired configuration are formed on the peripheral edge of the core 1. In this case, all the lead terminals 2 are tentatively held by a lead frame 15 in order to prevent disconnection of the lead terminals 2 in the case where the following process is used for removing a remaining photosensitized layer.

Then, an adhesive 4 is printed and applied to the whole surface of the core except for required portions on the surfaces of the base portion of the lead terminals 2 after completing washing and removal of the photosensitized layer, whereby the base portions of the lead terminals 2 are insulated from and secured to the core 1, and further, a flexible printed board 13 on which printed wiring as well as formation of through holes 11 have been previously made as shown in (FIG. 5(a7)) is bonded to the surface of the core thus processed.

Furthermore, the printed wiring 12 is electrically connected with the lead terminal 2 by means of solder or an electrically conductive adhesive 14 via the through hole 11.

Required parts are packaged with respect to the metallic core wiring substrate manufactured in accordance with the above-mentioned procedure by the reflow technique as described above. In this case, the lead frame 15 may, of course, be cut off and removed before or after packaging the parts.

The metallic core wiring substrate according to the present invention may be modified as described hereinbelow.

Figure 6:
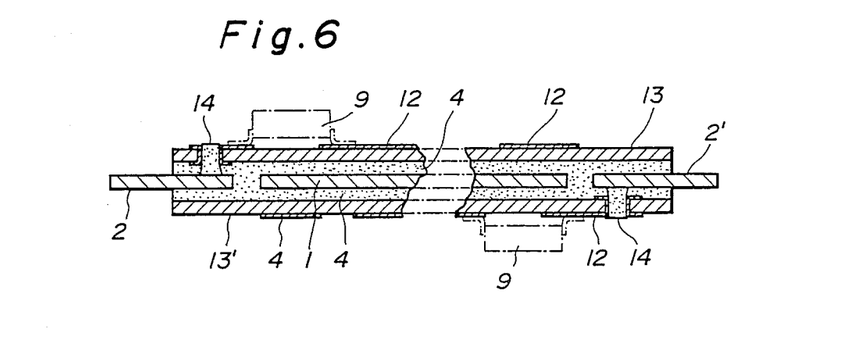
FIG. 6 is a sectional view showing a further example for which the metallic core wiring substrate according to the present invention is adapted.
Figure 7:
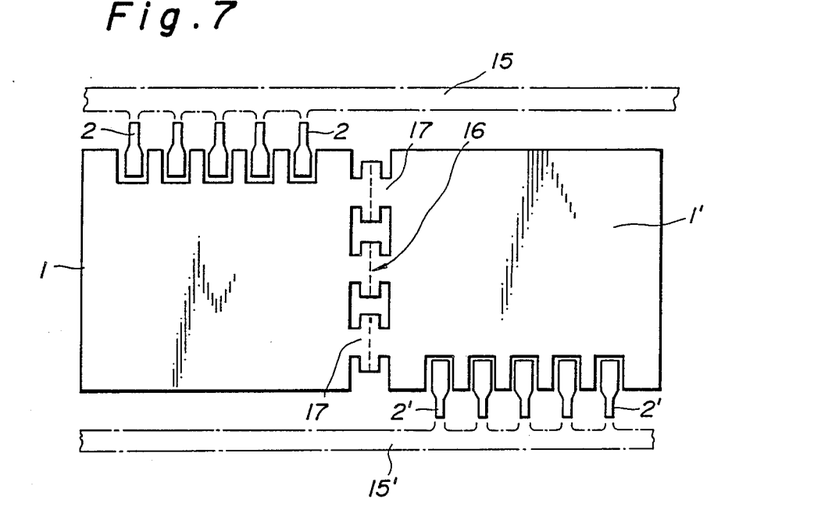
FIG. 7 is a planar view showing a still further example for which the metallic core wiring substrate according to the present invention is adapted.

More specifically, flexible printed boards 13 and 13' may be connected to the opposite sides of a core 1 as shown in FIG. 6. Further, a metallic core double-sided substrate as shown in FIG. 7 may be manufactured in such a manner that two coplanar sections of a core are prepared so as to obtain a pair of cores 1, 1' and lead frame portions 17 are formed at a central folding portion 16. For instance, a suitable perforated or grooved line can be formed on the central portion so as to provide convenient folding of the pair of cores. Flexible printed boards are bonded to the surfaces of the left and right cores 1 and 1' on the same side thereof, respectively, and then the left and right cores are folded along the folding portion 16 to superpose the two sections and make the conductive substrate double sided. In this case, the lead frames 17 may be separated from each other to make said cores 1 and 1' electrically independent of one another at the time when lead frames 15, 15', which integrally hold the lead terminals 2 as well as 2', are cut off from the cores 1 and 1'.

Figure 8:
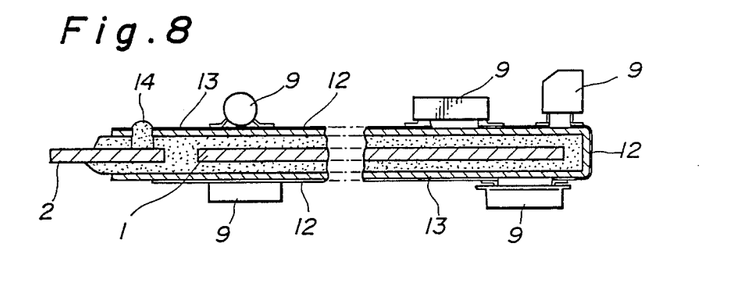
FIGS. 8 and 9 are sectional views each showing a further example for which the metallic core wiring substrate according to the present invention is adapted.

Alternatively, a flexible printed board 13 having an insulated printed wiring 12 thereon is bonded to a metallic core wiring substrate so as to surround a peripheral edge portion thereof as shown in FIG. 8, whereby it is possible to package required components on the opposite surface of the substrate with a high density.

Figure 9:
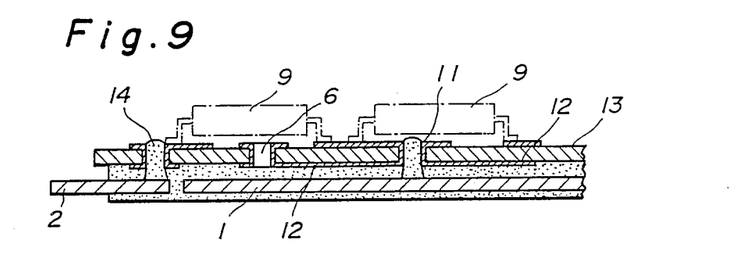

While the above examples have been described with respect to only the case where a conventional flexible wiring substrate is bonded to a metallic sheet to form a core, the present invention should not be limited thereto. The present invention is also suitable for combining the printed board with the core 1 in such a manner that the circuit 12 are concentrated on the joined surfaces of the wiring substrate and the core 1 as shown in FIG. 9, and components are packaged on the surface of the substrate at a high density via through holes 11. As a result, it is possible to easily realize packaging for required components at a high density as well as utilization of the core as a large area setting board by means of the metallic core wiring substrate according to the present invention. In this case, when electrical connection between at least one lead terminal and the conductive substrate is maintained, it is also possible to ground the conductive substrate through the lead terminal.

INDUSTRIALLY APPLICABLE FIELD

Since the present invention is constructed as described above, it is possible to inexpensively provide such a printed board which can satisfy severe requirements with respect to packaging of electronic circuits at a high density.

Furthermore, in the present metallic core wiring substrate, the core and the lead terminals are at the same plane, and in addition, the lead terminals are provided inside the printed circuit part. Accordingly, in the case where a higher density in packaging of required components is intended for a given space such as when a number of such wiring boards are vertically mounted on a mother board, and they are connected electrically one another, it becomes possible to decrease a height of the wiring board by a width corresponding to that of the base portion of the lead terminal, which is advantageous from the viewpoint of decreasing the entire volume of the electronic circuits.

In addition, the metallic core wiring substrate according to the present invention is remarkably effective for constructing a hybrid IC and the like which require favorable heat release and electrostatic or magnetic shielding properties.

While the present invention has been described with reference to the foregoing embodiments, it will be understood that various changes and modifications may be made thereto which fall within the scope of the appended claims.

We claim:

1. A metallic core wiring substrate, comprising an electrically conductive substrate covered with an insulating material, a plurality of leads being coplanar with said substrate and insulated electrically therefrom by said covering of insulating material, said leads being aligned and secured to one longitudinally extending edge of an outer periphery of said conductive substrate by said covering of insulating material, wiring patterns being applied to a surface of said covering of insulating material, and means for electrically connecting said wiring patterns with said leads.

2. A metallic core wiring substrate as claimed in claim 1, wherein opposite surfaces of said electrically conductive substrate are covered with said covering of insulating material so as to be capable of packaging electronic parts on the opposite surfaces of said substrate and said means for electrically connecting said wiring patterns to said leads comprises through holes in said covering of insulating material and in said wiring patterns, said wiring patterns being provided on said covering of insulating material on both opposite surfaces of said substrate.

3. A metallic core wiring substrate, comprising an electrically conductive substrate covered with an insulating material, a plurality of leads being coplanar with said substrate and insulated electrically therefrom by said covering of insulating material, said leads being aligned and secured to one longitudinally extending edge of an outer periphery of said conductive substrate by said covering of insulating material, a printed board containing printed wiring bonded with adhesive over at least one of two opposed surfaces of said conductive substrate outside of an area of said opposed surfaces wherein base portions of said leads are contained, and means for electrically connecting said wiring patterns on said printed board with said leads positioned around said outer periphery of said substance.

4. A metallic core wiring substrate as claimed in claim 3, wherein said means for electrically connecting said wiring patterns on said bonded printed board with said leads around said outer periphery of said substrate comprises through holes in said printed board.

5. A metallic core wiring substrate as claimed in claim 3, wherein said bonded printed board is a flexible printed wiring board, and said flexible printed wiring board extends around a portion of said outer periphery of said substrate and covers at least part of each of said two opposed surfaces of said substrate.

6. A metallic core wiring substrate as claimed in claim 1, wherein said substrate includes a folding portion thereon which is suitable for bending said substrate into two sections and printed boards are bonded to said two sections of said conductive substrate with said folding portion therebetween, said conductive substrate being bent along said folding portion such that said two sections are superposed to make said conductive substrate double-sided.

7. A metallic core wiring substrate comprising an electrically conductive substrate covered with an insulating material, a plurality of leads being coplanar with said substrate and insulated electrically therefrom by said covering of insulating material, said leads being aligned and secured to one longitudinally extending edge of an outer periphery of said conductive substrate by said covering of insulating material, wiring patterns being applied to a surface of said covering of insulating material, and means for electrically connecting said wiring patterns with said leads, said leads aligned on the outer periphery of the conductive substrate and the conductive substrate comprising pieces of a single sheet of material which has been separated into said leads and said substrate.

8. A metallic core wiring substrate as claimed in claim 1, further comprising a ground lead coplanar with said substrate and electrically connected thereto, said ground lead being aligned and secured to said outer periphery of said substrate by said covering of insulating material.

9. A metallic core wiring substrate comprising an electrically conductive substrate covered with an insulating material, a plurality of leads being coplanar with said substrate and insulated electrically therefrom by said covering of insulating material, said leads being aligned and secured to an outer periphery of said conductive substrate by said covering of insulating material, wiring patterns being applied to a surface of said covering of insulating material, and means for electrically connecting said wiring patterns with said leads, said covering of insulating material covering only part of said leads, said substrate including cut-outs, each of which becomes more narrow in a direction towards said outer periphery of said substrate and each of said leads having a base portion located in a respective one of said cut-outs, said base portion having a width which increases in a direction extending inwardly from said outer periphery of said substrate.

10. A metallic core wiring substrate as claimed in claim 1, wherein said leads are identical in shape.

11. A metallic core wiring substrate comprising an electrically conductive substrate covered with an insulating material, a plurality of leads being coplanar with said substrate and insulated electrically therefrom by said covering of insulating material, said leads being aligned and secured to an outer periphery of said conductive substrate by said covering of insulating material, wiring patterns being applied to a surface of said covering of insulating material, and means for electrically connecting said wiring patterns with said leads, said substrate including cut-outs in said outer periphery thereof and base portions of said leads extending into said cut-outs and being insulated from said substrate by said covering of insulating material.

12. A metallic core wiring substrate as claimed in claim 3, wherein said substrate includes a folding portion thereon which is suitable for bending said substrate into two sections and printed boards are bonded to said two sections of said conductive substrate with said folding portion therebetween, said conductive substrate being bent along said folding portion such that said two sections are superposed to make said conductive substrate double-sided.

13. A metallic core wiring substrate as claimed in claim 4, wherein said substrate includes a folding portion thereon which is suitable for bending said substrate into two sections and printed boards are bonded to said two sections of said conductive substrate with said folding portion therebetween, said conductive substrate being bent along said folding portion such that said two sections are superposed to make said conductive substrate double-sided.

14. A metallic core wiring substrate as claimed in claim 3, wherein said leads aligned on the outer periphery of the conductive substrate and the conductive substrate comprise pieces of a single sheet of material which has been separated into said leads and said substrate.

15. A metallic core wiring substrate as claimed in claim 3, further comprising a ground lead coplanar with said substrate and electrically connected thereto, said ground lead being aligned and secured to said outer periphery of said substrate by said covering of insulating material.

16. A metallic core wiring substrate as claimed in claim 3, wherein said covering of insulating material covers only part of said leads, said substrate includes cut-outs, each of which becomes more narrow in a direction towards said outer periphery of said substrate and each of said leads has a base portion located in a respective one of said cut-outs, said base portion having a width which increases in a direction extending inwardly from said outer periphery of said substrate.

17. A metallic core wiring substrate as claimed in claim 3, wherein said leads are identical in shape.

18. A metallic core wiring substrate as claimed in claim 3, wherein said substrate includes cut-outs in said outer periphery thereof and base portions of said leads extend into said cut-outs and are insulated from said substrate by said covering of insulating material.

19. A metallic core wiring substrate as claimed in claim 1, wherein at least two of said leads are secured to said one longitudinally extending edge of the outer periphery of said substrate and at least two more of said leads are secured to another longitudinally extending edge of the outer periphery of said substrate.

20. A metallic core wiring substrate as claimed in claim 3, wherein at least two of said leads are secured to said one longitudinally extending edge of the outer periphery of said substrate and at least two more of said leads are secured to another longitudinally extending edge of the outer periphery of said substrate.

* * * * *